(12) United States Patent
Hack et al.

(10) Patent No.: US 10,229,960 B2
(45) Date of Patent: Mar. 12, 2019

(54) OLED DISPLAYS WITH VARIABLE DISPLAY REGIONS

(71) Applicant: Universal Display Corporation, Ewing, NJ (US)

(72) Inventors: Michael Hack, Ewing, NJ (US); Michael S. Weaver, Ewing, NJ (US); Julia A. Brown, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 203 days.

(21) Appl. No.: 15/226,232

(22) Filed: Aug. 2, 2016

(65) Prior Publication Data

US 2018/0040676 A1  Feb. 8, 2018

(51) Int. Cl.
*H01L 27/32* (2006.01)
*G02B 27/01* (2006.01)

(52) U.S. Cl.
CPC ........ *H01L 27/326* (2013.01); *G02B 27/0172* (2013.01); *G02B 2027/0112* (2013.01); *G02B 2027/0147* (2013.01)

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,103,306 A * | 4/1992 | Weiman | G01S 5/163 348/400.1 |
| 5,247,190 A | 9/1993 | Friend et al. | |
| 5,282,051 A * | 1/1994 | Walker | G06T 3/40 358/401 |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 5,872,572 A * | 2/1999 | Rossignac | G06T 3/40 345/428 |

(Continued)

FOREIGN PATENT DOCUMENTS

| | | |
|---|---|---|
| EP | 1238981 | 9/2002 |
| JP | 2010/135467 | 6/2010 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Michael Lebentritt
(74) *Attorney, Agent, or Firm* — Riverside Law LLP (57) ABSTRACT

A display includes a frontplane having multiple pixels in a first pixel region and multiple pixels in a second pixel region. At least one display characteristic in the first pixel region is different from at least one display characteristic in the second pixel region. The at least one characteristic is selected from the group consisting of resolution, cavity mode, outcoupling, color and color filter. A display with a curved scan line and variable spaced data line backplane architecture is also described. In addition, a method of reducing power requirements in a display is described.

20 Claims, 7 Drawing Sheets

(56) References Cited

U.S. PATENT DOCUMENTS

| | | | |
|---|---|---|---|
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,081,870 B2 * | 7/2006 | Bronson | G02B 27/017 345/698 |
| 7,279,704 B2 | 10/2007 | Walters et al. | |
| 7,431,968 B1 | 10/2008 | Shtein et al. | |
| 7,968,146 B2 | 6/2011 | Wanger et al. | |
| 8,564,640 B2 * | 10/2013 | Jones | G08B 13/19693 348/36 |
| 9,036,074 B2 * | 5/2015 | Murata | G02B 3/0056 348/294 |
| 9,804,669 B2 * | 10/2017 | Fateh | G06F 3/011 |
| 2003/0169847 A1 * | 9/2003 | Karellas | A61B 6/481 378/98.3 |
| 2003/0230980 A1 | 12/2003 | Forrest et al. | |
| 2004/0174116 A1 | 9/2004 | Lu et al. | |
| 2004/0227703 A1 * | 11/2004 | Lamvik | G02B 27/0172 345/76 |
| 2010/0141874 A1 * | 6/2010 | Morita | G02F 1/133514 349/106 |
| 2010/0171683 A1 * | 7/2010 | Huitema | G02F 1/13452 345/55 |
| 2011/0207328 A1 * | 8/2011 | Speakman | H01L 51/0011 438/694 |
| 2011/0286077 A1 * | 11/2011 | Chan | G02F 1/167 359/296 |
| 2012/0236121 A1 * | 9/2012 | Park | H04N 13/0253 348/46 |
| 2013/0026452 A1 | 1/2013 | Kottas et al. | |
| 2013/0027645 A1 * | 1/2013 | Yamakawa | G02F 1/133514 349/106 |
| 2013/0114219 A1 * | 5/2013 | Garner | G02F 1/133308 361/750 |
| 2013/0119354 A1 | 5/2013 | Ma et al. | |
| 2013/0135279 A1 * | 5/2013 | Pui | G09G 3/20 345/211 |
| 2013/0137333 A1 * | 5/2013 | Watts | G02F 1/133305 445/24 |
| 2014/0266990 A1 * | 9/2014 | Makino | G02B 27/017 345/8 |
| 2014/0267839 A1 * | 9/2014 | Nishimaki | H04N 5/367 348/246 |
| 2014/0362126 A1 * | 12/2014 | Jeong | G09G 3/3233 345/690 |
| 2015/0349034 A1 | 12/2015 | Hack et al. | |
| 2016/0068753 A1 * | 3/2016 | Kawamura | C09K 19/20 252/299.61 |
| 2016/0124263 A1 * | 5/2016 | Park | G02F 1/13394 349/43 |
| 2016/0284287 A1 * | 9/2016 | Cho | G09G 3/3607 |
| 2016/0293099 A1 | 10/2016 | Hack et al. | |
| 2016/0372690 A1 * | 12/2016 | Hack | H01L 51/0097 |
| 2016/0380238 A1 | 12/2016 | Ma et al. | |
| 2017/0062531 A1 * | 3/2017 | Hack | H01L 27/3213 |
| 2017/0186368 A1 * | 6/2017 | Hirai | G09G 3/3225 |
| 2017/0345370 A1 * | 11/2017 | Hack | G09G 3/3258 |

FOREIGN PATENT DOCUMENTS

| | | |
|---|---|---|
| WO | 2004/111066 | 12/2004 |
| WO | 2008/044723 | 4/2008 |
| WO | 2008057394 | 5/2008 |
| WO | 2010011390 | 1/2010 |
| WO | 2010/111175 | 9/2010 |

OTHER PUBLICATIONS

Baldo et al., "Very high-efficiency green organic light-emitting devices based on electrophosphorescence," Appl. Phys. Lett., vol. 75, No. 1, 4-6 (1999).

* cited by examiner

OLED DISPLAYS WITH VARIABLE DISPLAY REGIONS

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to displays and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, signage, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

The pixel design in conventional OLED displays is typically uniform across the entire display active area, with all pixels having nominally identical characteristics. Each pixel may contain sub-pixels that emit light of different colors. For certain applications, such as near eye applications (e.g. virtual or augmented reality headsets), it is desirable to have very high resolution displays (e.g. >1,000 dpi). However, high resolution displays have higher energy requirements and may produce excess heat, which is especially undesirable for near eye applications.

For example, high resolution display areas require very small pixels, and this leads to smaller sub-pixel aperture ratios which in turn increases display power consumption and reduces display lifetime. In addition, it is very difficult to make high resolution fine metal mask shadow masks to allow for the fabrication of RGB side by side (SBS) displays, or other formats where patterned OLED depositions are required.

Still, other display applications may utilize a display fabricated with curved edges or even the whole display curved, foldable or rollable. While bottom emission OLEDs generally have Lambertian emission, most small displays now use top emission OLEDs, and this could also be true for televisions in the future. The output of top emission OLEDs (color and luminance) varies with viewing angle, so while looking at the light emission from a curved OLED top emission display, one will see color shifts and intensity changes much more drastically compared to viewing a similar flat display.

Thus, what is needed in the art are improved displays that operate at lower power levels and reduce the unnecessary generation of heat, especially for high resolution headset display applications. In addition, improved displays are needed to reduce the change in appearance that comes with viewing OLEDs fabricated on curved surfaces. It is desirable to ensure minimal color shift when viewing the curved edge region, even if the luminance of this curved region is slightly lower than the flat region. Finally, the improved displays should offer improvements to the manufacturing process.

SUMMARY OF THE INVENTION

A display including a frontplane having multiple pixels in a first pixel region and multiple pixels in a second pixel region, where at least one display characteristic in the first pixel region is different from the at least one display characteristic in the second pixel region, and where the at least one characteristic is selected from the group consisting of resolution, cavity mode, outcoupling, color and color filter. In one embodiment, the characteristic is resolution, and wherein the resolution in the first pixel region is greater than the resolution in the second pixel region. In one embodiment, the display includes blue subpixels in the first pixel region only. In one embodiment, the pixels in the second pixel region are green. In one embodiment, the pixels in the second pixel region comprise two colors of subpixels. In one embodiment, the first pixel region comprises no more than 50% of the display active area. In one embodiment, the first pixel region is a central region of the frontplane, and the second pixel region is a peripheral region of the frontplane. In one embodiment, the pixel resolution in the first region is at least 1,000 dpi, and in certain embodiments is at least 1,500 dpi. In one embodiment, the output of blue light in the second region is less than the output of blue light in the first region. In one embodiment, the pixels in the first region are smaller than the pixels in the second region. In one embodiment, the number of subpixels per pixel in the first region is greater than the number of subpixels per pixel in the second region. In one embodiment, the color temperature of the pixel white point in the second region is less than the color temperature of the pixel white point in the first region. In one embodiment, the pixels are selected from the group consisting of OLED, LED, Micro LEDs and LCDs. In one embodiment, the display includes a backplane having multiple scan lines and data lines, and two or more of the scan lines are curved. In one embodiment, the degree of curvature of the scan lines increases for scan lines positioned closer to a periphery of the display. In one embodiment, the spacing between data lines is variable. In one embodiment, the spacing between adjacent data lines increases towards a periphery of the display. In one embodiment, the display includes a third pixel region between the first and second pixel regions, where the difference in the at least one display characteristic transitions gradually across the third pixel region. In one embodiment, the first pixel region is disposed across a flat portion of the frontplane and wherein the second pixel region is disposed across a curved portion of the frontplane. In one embodiment, the sub-pixel devices are designed differently in the first pixel region as compared to the second pixel region. In one embodiment, the pixels are OLED stacks; each OLED stack includes an anode and a cathode layer; and at least one of the anode and cathode layers in each OLED stack are designed differently in the first pixel region as compared to the second pixel region. In one embodiment, a product including the display is selected from the group consisting of an OLED display, a LED display, a micro-LED and LCD display, a virtual reality display, an eyewear display, a headset display, a flat panel display, a computer monitor, a 3D display, a medical monitor, a television, a billboard, a heads up display, a fully transparent display, a flexible display, a laser printer, a telephone, a cell phone, a personal digital assistant, a laptop computer, a digital camera, a camcorder, a viewfinder, an augmented reality display, a micro-display, a vehicle, a large area wall, a theater or stadium screen, and a sign.

A display including a frontplane having multiple variable resolution pixels; and a backplane having a plurality of curved scan lines and a plurality of variable spaced data lines; where the degree of curvature of the scan lines increases towards a periphery of the display; and where the distance between adjacent data lines increases towards the periphery of the display. In one embodiment, the multiple variable resolution pixels includes a first pixel resolution in a central region of the frontplane, and a second pixel resolution different than the first pixel size in a peripheral region of the frontplane. In one embodiment, a pixel resolution in the central region is at least 1,500 dpi. In one embodiment, the pixels in the central region are smaller than the pixels in the periphery region. In one embodiment, the number of subpixels per pixel in the central region is greater than the number of subpixels per pixel in the periphery region. In one embodiment, the pixels are selected from the group consisting of OLED, LED, Micro LEDs and LCDs. In one embodiment, a product including the display is selected from the group consisting of a virtual reality display, an eyewear display, a headset display, a flat panel display, a computer monitor, a medical monitor, a television, a billboard, a heads up display, a 3D display, a fully transparent display, a flexible display, a laser printer, a telephone, a cell phone, a personal digital assistant, a laptop computer, a digital camera, a camcorder, a viewfinder, an augmented reality display, a micro-display, a vehicle, a large area wall, a theater or stadium screen, and a sign.

In one embodiment, a display including a frontplane has multiple pixels across a display active area, where at least one display characteristic in the display active area changes gradually when moving away from a central point of the display active area towards a periphery of the display active area, and wherein the at least one characteristic is selected from the group consisting of resolution, cavity mode, outcoupling, color and color filter.

In one embodiment, a method of reducing power requirements in a display having multiple pixels includes decreasing the resolution of pixels about at least a portion of the periphery of the display active area as compared to the resolution of pixels about a central axis of the display active area.

BRIEF DESCRIPTION OF THE DRAWINGS

FIGS. 4A-4C are diagrams of high resolution and low resolution pixel regions according to various embodiments.

DETAILED DESCRIPTION

It is to be understood that the figures and descriptions of the present invention have been simplified to illustrate elements that are relevant for a more clear comprehension of the present invention, while eliminating, for the purpose of clarity, many other elements found in displays. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
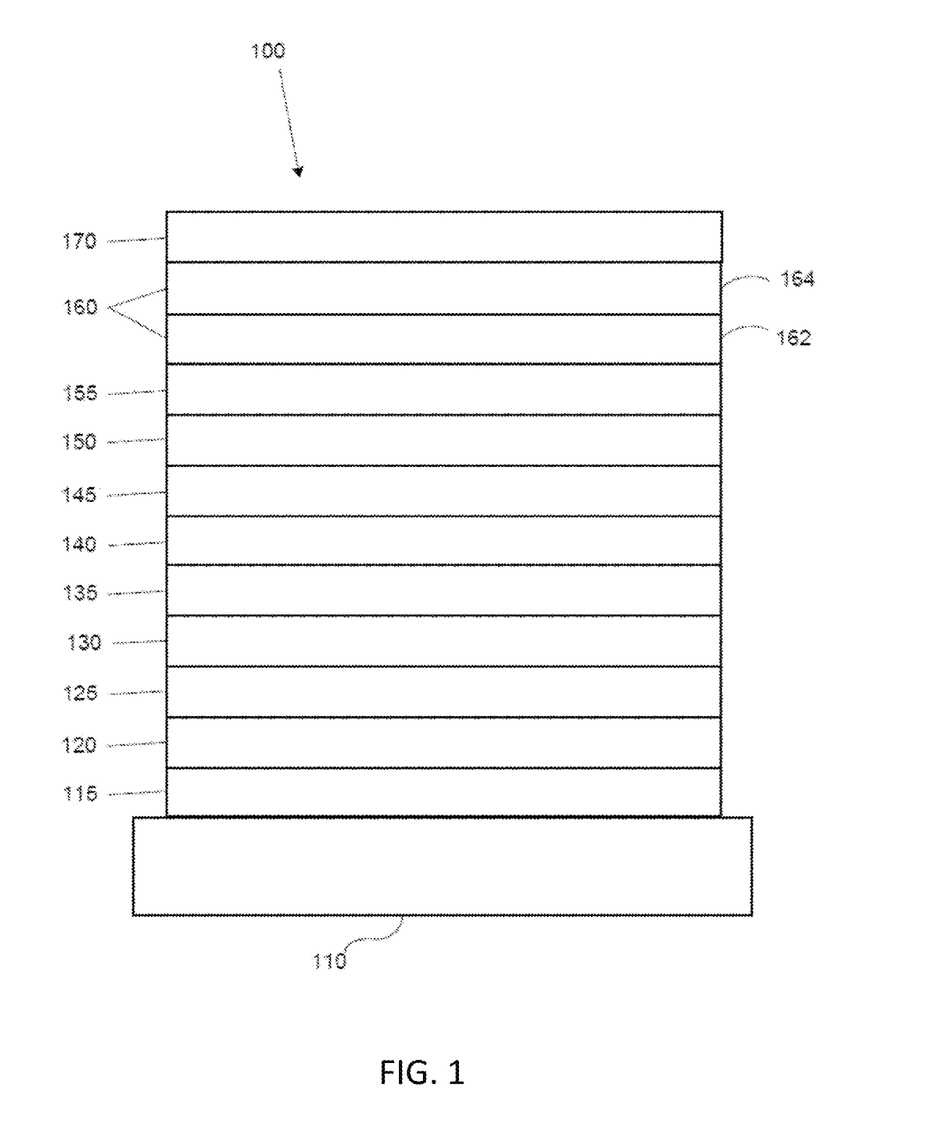
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
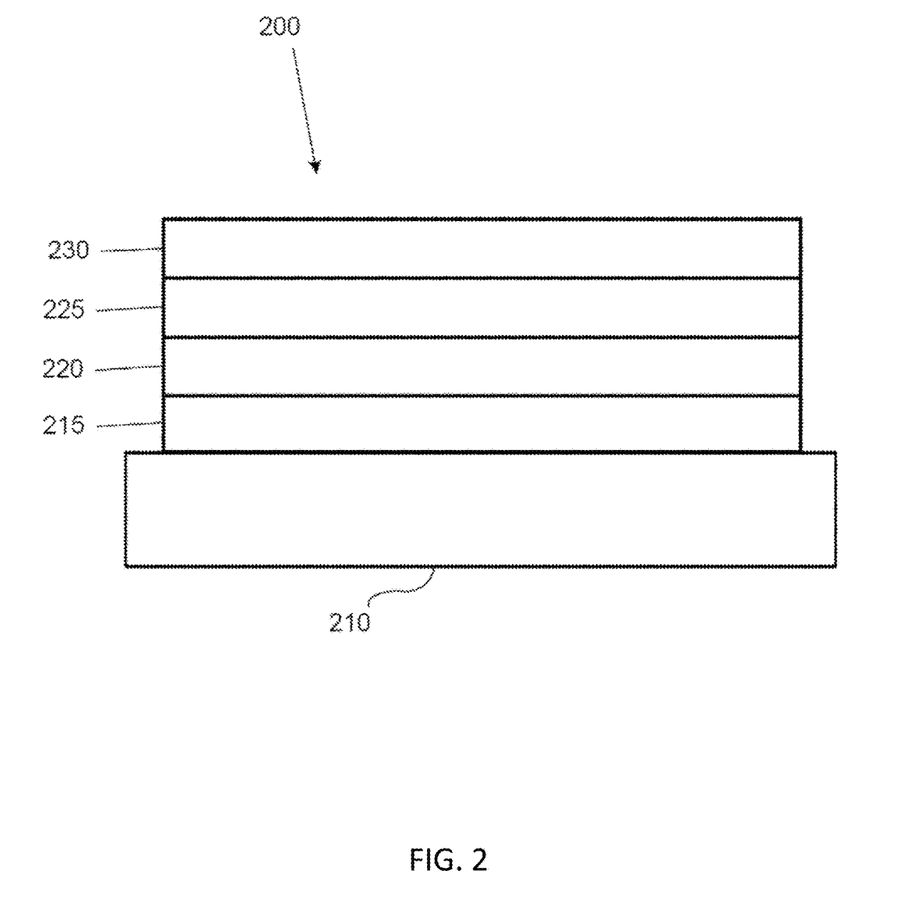
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Figure 3:
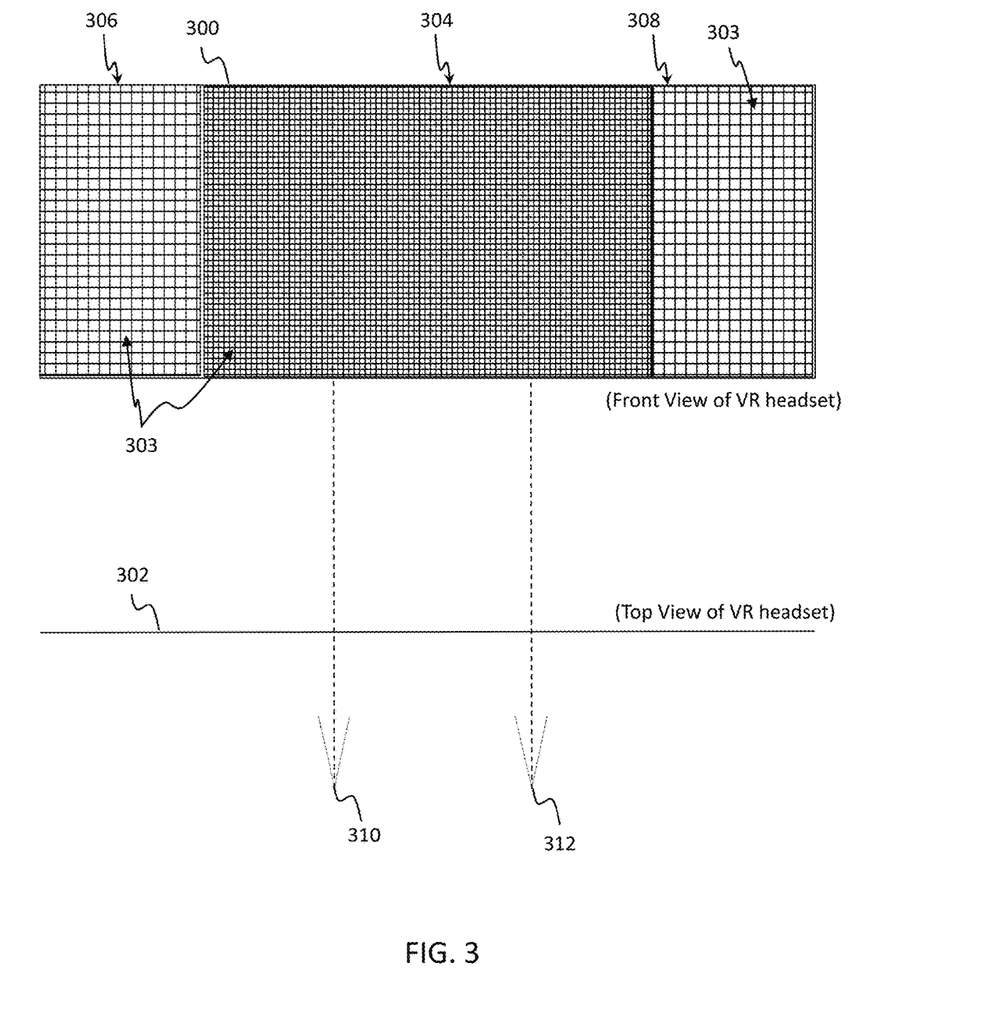
FIG. 3 shows a schematic of a display having a central high resolution pixel region and two peripheral low resolution pixel regions according to one embodiment.

With reference now to FIG. 3, a schematic is shown of a user viewing a display 300 according to one embodiment. In the present embodiment, the user's eyes 310, 312 are viewing a display 300 that is integrated into a product, such as a VR headset. The display 300 has a frontplane including a display active area 303 having multiple pixels. The pixels in the display active area 303 are connected to and controlled by circuitry in the backplane, including scan lines and data lines that in certain embodiments is built upon a flexible substrate. In the frontplane, there are three pixel regions, including a first pixel region 304 positioned substantially in the center of the display active area 303, and second and third pixel regions 306, 308 positioned on left and right peripheries of the display active areas 303. In one embodiment, at least one display characteristic of the first region of pixels 304 is different from a display characteristic of the second 306 and third 308 pixel regions. In one embodiment, the display characteristic is at least one of resolution, cavity mode, outcoupling, color and color filter. It should be appreciated that the frontplane, described herein as having multiple pixel regions in a display active area, may be a continuous area of pixels where all pixel regions are driven by a designated chip/driver set, providing an advantage over displays where two or more frontplanes or two or more pixel sets are provided and driven by separate or independent chip/driver sets or show different video information. For example, a frontplane consisting of a display active area showing video or static images as well containing peripheral areas with fixed icons would not be considered as one continuous area of pixels.

When a user is wearing the VR headset, their eyes 310, 312 are usually in a fixed position looking forward at the display 302 as illustrated. Since the eye's performance varies greatly with angle away from where the eye is focused (e.g. peripheral vision is less sensitive to color, especially blue, and much less sensitive to the spatial resolution of the image), embodiments of the invention advantageously vary display characteristics across the display to improve display efficiency by reducing power requirements, light output and/or other visual effects in the regions of the display that correspond to areas of less eye focus.

In one embodiment, the first pixel region 304 has a first resolution, and the second and third pixel regions 306, 308 have a second resolution. In most embodiments, it is generally desirable to have a higher resolution in the first pixel region 304 since as stated above, the eye is less sensitive to lower resolution in peripheral vision. In certain embodiments, the first pixel region 304 has smaller pixels than the second and third pixel regions 308, 308 to give it a higher resolution. In certain embodiments, the first pixel region has more subpixels per pixel relative to the second and third pixel regions 308, 308 to give it a higher resolution, and the ability to produce more colors. In certain embodiments, the pixel resolution of the first pixel region 304 is at least 1,000 dpi, and in other embodiments is at least 1,500 dpi. In certain embodiments, 2, 3, 4, 5, 6, 7, 8 or more different pixel regions each having different display characteristics are included in portions of the display active area. In one embodiment, instead of defined pixel regions, a gradual change or a gradual increase in pixel size can be implemented moving away from central viewing areas of the display. As a further advantage, lowering the display resolution towards the periphery of the display will lower power consumption in this region relative to the higher resolution central region because of higher fill factors associated with larger pixels. In addition, the fine metal mask needed to manufacture patterned sub-pixels can implement larger features for the areas away from the display central viewing zone, which will increase mask strength. This is especially important for very high resolution displays where the mask opening and spacings are very small, making mask fabrication both difficult and expensive. Relaxing resolution for part of each mask will relax manufacturing constraints, improving mask yield.

Specific color subpixels can be included or excluded from certain regions to enhance display efficiency. In certain embodiments, only pixels in the first pixel region 304 include a blue subpixel. In one embodiment, the color temperature of the pixel white point is decreased moving away from the peak viewing zone, so that pixels at the display edge may have little, or even no blue sub-pixels. This will further allow for much reduced display power consumption. Since the eye is less sensitive to blue in peripheral vision, eliminating blue subpixels in peripheral portions of the display can advantageously make the display more efficient without sacrificing the quality of the user's experience. In one embodiment, the pixels in the second region are green, to reduce power consumption in the second region. In one embodiment, the output of blue light in the second region is less than the output of blue light in the first region. Output can include, for example and without limitation, optical power per unit area, luminous intensity and total luminous flux.

Figure 4A:
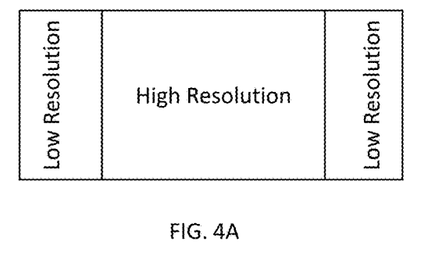
FIG. 4A shows a central rectangular pixel region between two low resolution pixel regions.
Figure 4B:
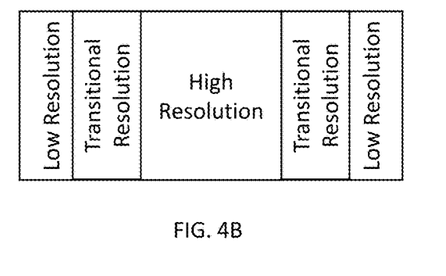
FIG. 4B shows transitional resolution pixel regions positioned between a high resolution pixel region and low resolution pixel regions.
Figure 4C:
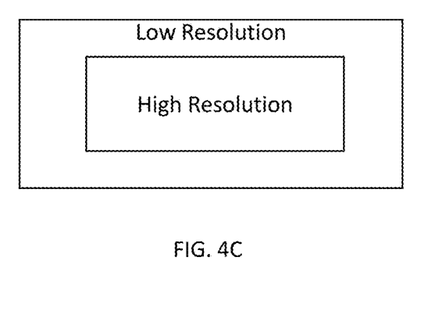
FIG. 4C shows a rectangular high resolution pixel region surrounded by a rectangular low resolution pixel region.
Figure 4D:
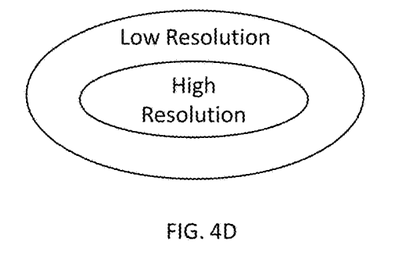
FIG. 4D shows an oval high resolution pixel region surrounded by an oval low resolution pixel region.
Figure 4E:
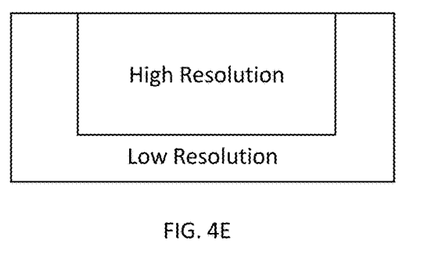
FIG. 4E shows a rectangular high resolution pixel region extending to a portion of a single edge of the display active area.
Figure 4F:
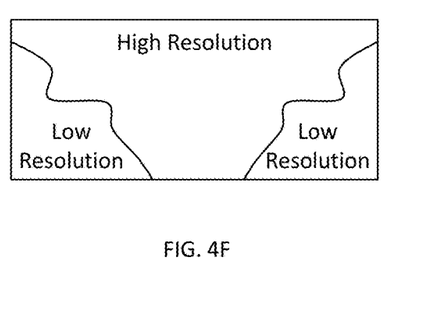
FIG. 4F shows two separate high resolution pixel regions (one irregular and one rectangular) surrounded at least partially by a low resolution pixel region.

The geometry of the higher resolution pixel regions and the lower resolution pixel regions can vary. For instance, with reference to FIG. 3, the central high resolution pixel region is rectangular and is centered in a larger rectangular display active area. In this embodiment, the central high resolution pixel region extends to the top and bottom edges of the display active area. However, any geometry capable of being formed by multiple pixels can form the outline of the high resolution pixel region. This means that practically any shape can take the form of the high resolution pixel region, including but not limited to a square, rectangle, triangle, pentagon, hexagon, septagon, octagon, circle, half-circle, oval, star, trapezoid, irregular shape, and shapes with any combination of curved, straight and pointed edges. With reference now to FIG. 4A-4F, various example embodiments of variable resolution pixel geometries are shown. FIG. 4A shows a diagram representing the central high resolution pixel region geometry explained above with reference to FIG. 3. With reference now to FIG. 4B, a transitional resolution pixel region can be included between the high resolution pixel region and the low resolution pixel region. In one embodiment, the transitional resolution pixel region includes a set of pixels that displays a medium resolution higher than the resolution of the adjacent low resolution pixel region but lower than the resolution of the adjacent high resolution pixel region. In other embodiments, the transitional resolution pixel region includes two or more pixel regions that graduate to gradually transition the resolution between the high resolution pixel region and the low resolution pixel region. The transitional resolution pixel region can include 2, 3, 4, 5, 6, 7, 8 or more graduating pixel regions. The high resolution pixel region can be entirely surrounded by the low resolution pixel region according to certain embodiments, with reference now to FIGS. 4C and 4D. FIG. 4C shows a rectangular high resolution pixel region completely surrounded by a rectangular low resolution pixel region. Similarly, FIG. 4D shows a oval high resolution pixel region completely surrounded by an oval low resolution pixel region. FIG. 4E shows an example of a high resolution pixel region extending from a center of the display to a portion of one edge of the display active area, while the low resolution pixel region extends to all remaining edges of the display active area not covered by the high resolution pixel region. As shown specifically in FIG. 4F, more than one low resolution pixel region can be configured within a single low resolution pixel region. Multiple high resolution pixel regions can also be employed. Also, as shown specifically in FIG. 4F, the geometry of the high or low resolution pixel area does not have to match the geometry of the overall display active area, and either of the high or low resolution pixel regions can be an irregular shape. Asymmetry is also suitable for certain embodiments. Further, when desirable, lower resolution pixel regions can be positioned at center portions of the display active area, and high resolution pixel regions can be situated closer to or on the outer portions of the display active area, within the normal peripheral vision of the user. In certain embodiments, the display active area is split evenly side-by-side between one low resolution pixel region and one high resolution pixel region. In other embodiments, the split is not even, and the relative orientation between low and high resolution pixel regions can be left-right, top-bottom, or a diagonal split.

In certain embodiments, within high resolution regions, the pixel geometry can be changed by data input, for instance, by specifying a region where blue subpixels will be active (e.g. the high resolution pixel region) and where they will be deactivated (e.g. the low resolution pixel region). This way, software can be used to expand, shrink and/or change the shape of the high resolution pixel region according to user preference, environmental conditions, or for adjusting to the specific task at hand. In certain embodiments, the high resolution pixel area is automatically adjusted by utilizing eye tracking techniques known in the art so that the high resolution pixel region shifts to the area of the display active area corresponding to where the user's eyes are focused.

Embodiments of the display are especially advantageous for wrap-around displays with a significant portion of the display positioned in the user's peripheral vision. Further, in certain embodiments, the use of circular polarizers (used in OLED displays to increase contrast ratio) may be omitted as the enclosed nature of the VR wrap-around display will naturally prevent unwanted reflections off the display surface.

A product including the display can for example be a virtual reality display, an eyewear display, a headset display, a flat panel display, a computer monitor, a medical monitor, a television, a billboard, a heads up display, a fully transparent display, a flexible display, a laser printer, a telephone, a cell phone, a personal digital assistant, a laptop computer, a digital camera, a camcorder, a viewfinder, an augmented reality display, a micro-display, a 3D display, a vehicle, a large area wall, a theater or stadium screen, and a sign. The display pixels can be any light emitting element, such as for example OLEDs, LEDs, Micro LEDs and back-lit or front-lit LCDs.

Displays are typically built around the concept of constant sized pixels across a display, utilizing low resistance interconnects to take electrical signals and power from the periphery of the display to each pixel. Accordingly, a novel backplane architecture is disclosed to enable power, a data signal, and a scan line signal for display active areas utilizing a variable display resolution. According to these embodiments, the scan lines can be sequentially enabled during each frame time, allowing the data lines to provide the correct luminance information to each pixel while its scan line is enabled.

Figure 5:
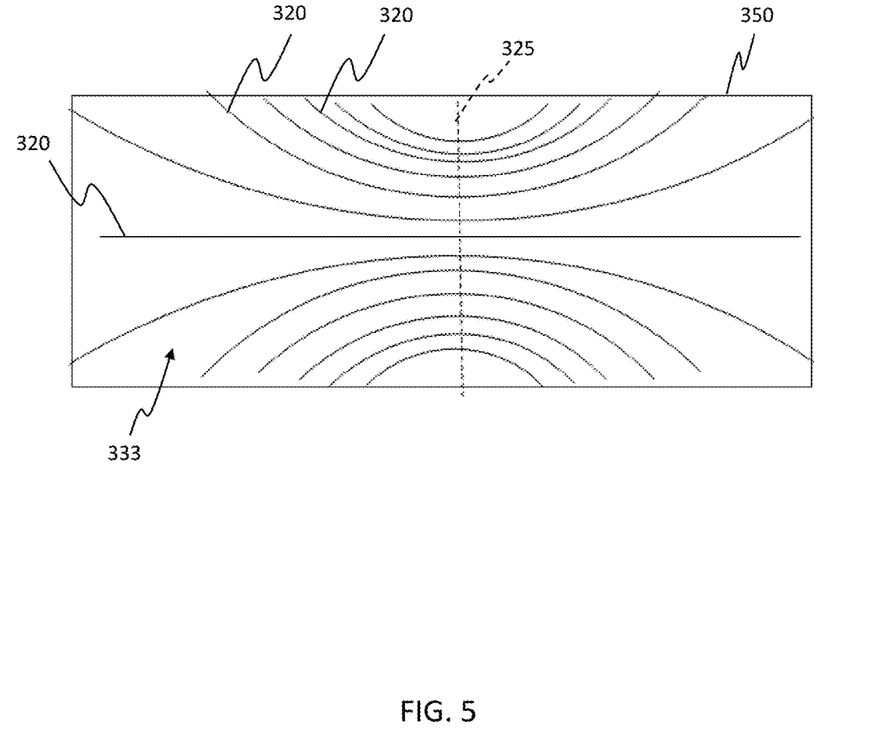
FIG. 5 is a schematic of scan lines in a display with variable resolution decreasing away from the vertical central axis.

With reference now to FIG. 5, according to one embodiment, scan lines 320 are curved to drive a display 350 where the pixel size increases across the display active area 333 moving away from its central vertical axis 325. The scan lines 320 curve as shown with many fewer pixels along any given vertical line closer to the display periphery than near its central axis 325. In certain embodiments, the data lines may be curved. In certain embodiments, these scan lines 320 are driven by an integrated shift register whose output for each line will have a constant pitch. The shift register can be placed along the central axis 325 so that it is in a region where the pixel pitch is constant in a vertical direction, and in this case could be connected by vias to the scan lines emanating out from the central vertical axis. Alternatively, the shift register could be placed along a display edge, and conductive traces in the backplane could be used to connect the outputs of the shift register to each scan line. In one embodiment, the degree of curvature of the scan lines increases for scan lines positioned closer to the periphery of the display. The degree of curvature of the scan lines can be customized to correspond with the configuration of the high and low resolution pixels. Accordingly, it should be appreciated that any pattern or degree of curvature of either the scan lines or the data lines may be used to connect the variable subpixels across the display active area.

Figure 6:
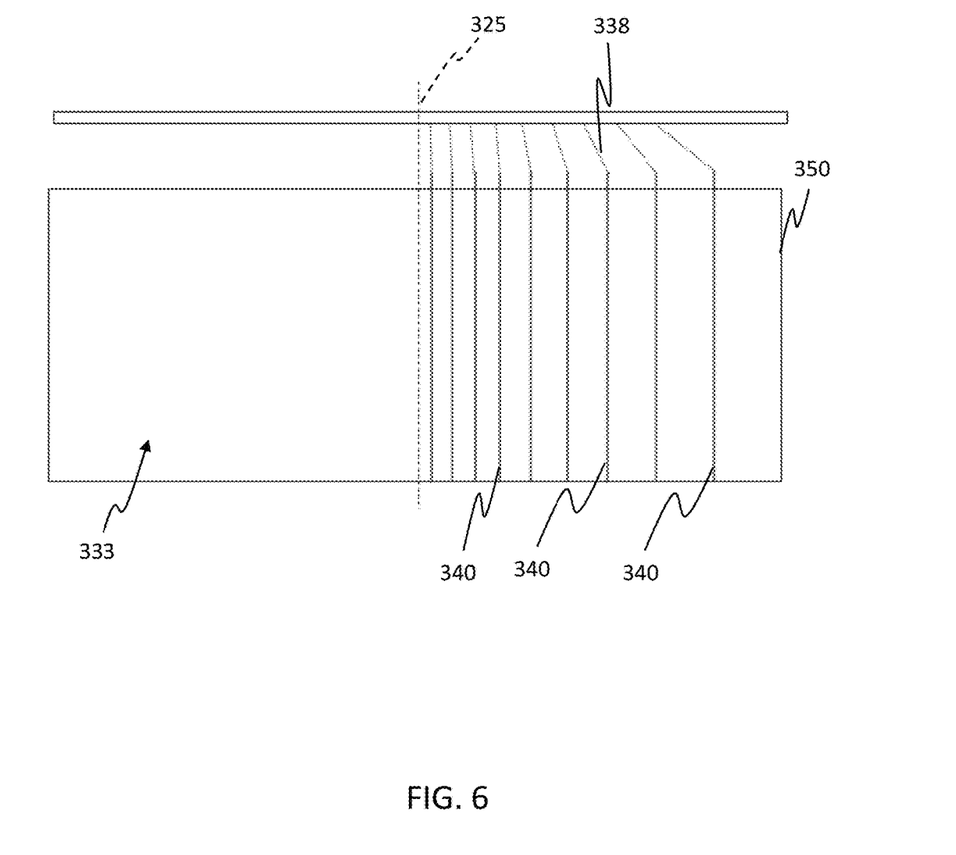
FIG. 6 is a schematic of data lines in a display with variable resolution decreasing away from the vertical central axis with fan out connections to data drivers of constant pitch.

With reference now to FIG. 6, a data driver configuration is shown according to one embodiment. Whereas data drivers usually have a constant pitch, the current embodiment features a fan out of conductors 338 to connect the constantly spaced driver chip pins to the variable spaced data lines 340. In another embodiment, a multiplexer is used to connect the data lines to external drivers. Scan lines and data lines can be customized to follow any geometry of variable resolution pixel regions according to the methods disclosed herein as would be understood by those having ordinary skill in the art.

Figure 7:
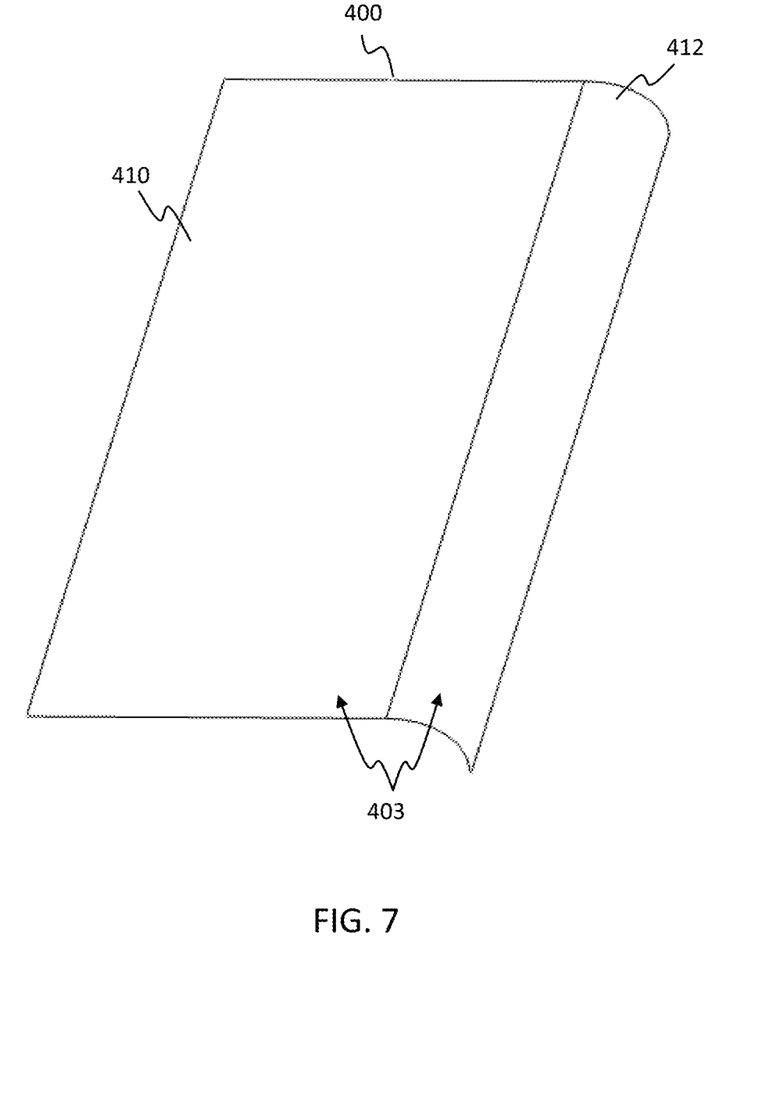
FIG. 7 is a schematic of a display with a flat central viewing region and a curved edge region.

With reference now to FIG. 7, a display 400 having a flat central viewing region 410 and a curved edge region 412 of a display active area 403 is shown. In one embodiment, to optimize display design, top emission or cavity OLEDs (bottom or top emission) are utilized for the flat region 410 of the display and non-cavity OLEDs for the curved region 412. This can be constructed by using different anode materials for the two sections, such as a reflective metal anode for the flat region and a transparent conductor anode for the curved edge region. Alternatively, for a top emitting display, the cathode or capping layer in the curved region can be of different composition or thickness in order to change the cavity optics in the curved versus flat regions. In certain embodiments, when desirable, since the curved region will have lower efficiency than the flat region, the display driver could adjust (e.g. increase) the intensity of the pixels in the curved region to make their luminance comparable to the pixels in the flat region.

In one embodiment, for compensating the display to ensure same output from a lower efficiency curved region than a higher efficiency flat region, the resolution is reduced in the curved region so it will have higher aperture ratio and therefore can achieve a higher luminance without increasing the current density of the drive, so as not to impact display lifetime. Accordingly, the curved edge can have the same luminance as the flat region without any impact on lifetime. Having a lower resolution for the curved portion may not be critical as the information viewed on a curved edge of a display will not be the same as that on a flat central region. A lower resolution edge region could also improve manufacturing yield allowing for increased tolerances in this region to improve device flexibility, for example, wider conductive lines that will crack less with repetitive flexing.

In one embodiment, since the pixels in the curved edge region with a non-cavity structure have different color output from the flat region, different emitters or optical stacks could be employed in the two regions so as to ensure the same color output for both regions. This can be enabled through the use of low resolution masking in the case of VTE deposited OLEDs. Other layers in the OLED stack may also be deposited at a different thickness in this region again to modify the device cavity to preferentially change the emission characteristics (e.g. color, efficiency) in the curved region of the display. Different outcoupling or color filters may also be employed in the two regions so as to ensure similar output for both the cavity and non-cavity pixels. Examples of outcoupling systems and mechanisms that may be implemented can be found in U.S. application Ser. No. 15/173,109, incorporated by reference herein in its entirety. Color filters can be implemented using various techniques known in the art, including gelatin dyeing, pigment impregnation, printing, electroplating and toppan printing.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting. The disclosures of each and every patent, patent application, and publication cited herein are hereby incorporated herein by reference in their entirety.

We claim:

1. A display comprising:
a frontplane having a plurality of pixels in a first pixel region and a plurality of pixels in a second pixel region;
a scan line electrically connected to at least one pixel in the first pixel region and at least one pixel in the second pixel region; and
a data line electrically connected to at least one pixel in the first pixel region and at least one pixel in the second pixel region;
wherein at least one display characteristic in the first pixel region is different from the at least one display characteristic in the second pixel region; and
wherein the at least one characteristic is selected from the group consisting of resolution, cavity mode, color, outcoupling, and color filter.

2. The display of claim 1, wherein the characteristic is resolution, and wherein the resolution in the first pixel region is greater than the resolution in the second pixel region.

3. The display of claim 2, wherein the display includes blue subpixels in the first pixel region only.

4. The display of claim 2, wherein the pixels in the second pixel region contain only green sub-pixels.

5. The display of claim 1, wherein the first pixel region is a central region of the frontplane, and the second pixel region is a peripheral region of the frontplane.

6. The display of claim 1, wherein the pixels in the first region are smaller than the pixels in the second region.

7. The display of claim 1, wherein the number of subpixels per pixel in the first region is greater than the number of subpixels per pixel in the second region.

8. The display of claim 1, wherein the color temperature of the pixel white point in the second region is less than the color temperature of the pixel white point in the first region.

9. The display of claim 1, further comprising a backplane having a plurality of scan lines and data lines, and wherein two or more of the scan lines are curved.

10. The display of claim 9, wherein the degree of curvature of the scan lines increases for scan lines positioned closer to a periphery of the display.

11. The display of claim 9, wherein the spacing between data lines is variable.

12. The display of claim 1, further comprising a third pixel region between the first and second pixel regions, wherein the difference in the at least one display characteristic transitions gradually across the third pixel region.

13. The display of claim 1, wherein the first pixel region is disposed across a flat portion of the frontplane and wherein the second pixel region is disposed across a curved portion of the frontplane.

14. The display of claim 1, wherein the pixels are OLED stacks; wherein each OLED stack includes an anode and a cathode layer; wherein at least one of the anode and cathode layers in each OLED stack are designed differently in the first pixel region as compared to the second pixel region.

15. The display of claim 1, wherein the display is incorporated into a product selected from the group consisting of an OLED display, a LED display, a micro-LED and LCD display, a virtual reality display, an eyewear display, a headset display, a flat panel display, a computer monitor, a 3D display, a medical monitor, a television, a billboard, a heads up display, a fully transparent display, a flexible display, a laser printer, a telephone, a cell phone, a personal digital assistant, a laptop computer, a digital camera, a camcorder, a viewfinder, an augmented reality display, a micro-display, a vehicle, a large area wall, a theater or stadium screen, and a sign.

16. A display, comprising:
   a frontplane having a plurality of variable resolution pixels; and
   a backplane having a plurality of curved scan lines and a plurality of variable spaced data lines;
   wherein the degree of curvature of the scan lines increases towards a periphery of the display; and
   wherein the distance between adjacent data lines increases towards the periphery of the display.

17. The display of claim 16, wherein the plurality of variable resolution pixels includes a first pixel resolution in a central region of the frontplane, and a second pixel resolution different than the first pixel size in a peripheral region of the frontplane.

18. The display of claim 17, wherein the pixels in the central region are smaller than the pixels in the periphery region.

19. The display of claim 17, wherein the number of subpixels per pixel in the central region is greater than the number of subpixels per pixel in the periphery region.

20. A display, comprising:
   a frontplane having a plurality of pixels across a display active area;
   a scan line electrically connected to first and second pixels of the plurality of pixels;
   a data line electrically connected to third and fourth pixels of the plurality of pixels;
   wherein at least one display characteristic in the display active area changes gradually when moving away from a central point of the display active area towards a periphery of the display active area;
   wherein the at least one display characteristic of the first and second pixels is different; and;
   wherein the at least one display characteristic of the third and fourth pixels is different; and
   wherein the at least one characteristic is selected from the group consisting of resolution, cavity mode, color, outcoupling and color filter.

* * * * *